United States Patent [19]
Gill et al.

[11] Patent Number: 5,283,203
[45] Date of Patent: Feb. 1, 1994

[54] SELF-ALIGNED CONTACT PROCESS FOR COMPLEMENTARY FIELD-EFFECT INTEGRATED CIRCUITS

[75] Inventors: Manzur Gill, Arcola; Danny Shum, Sugarland, both of Tex.

[73] Assignee: Texas Instruments Incorporated, Dallas, Tex.

[21] Appl. No.: 843,705

[22] Filed: Feb. 28, 1992

[51] Int. Cl.$^5$ ............................ H01L 21/265
[52] U.S. Cl. ........................ 437/34; 437/44; 437/56; 148/DIG. 18; 148/DIG. 133
[58] Field of Search ............. 148/DIG. 18, DIG. 133; 437/56, 34, 44

[56] References Cited
U.S. PATENT DOCUMENTS

| | | | |
|---|---|---|---|
| 4,312,046 | 1/1982 | Taylor | 148/18 |
| 5,032,537 | 7/1991 | Yoshizumi et al. | 437/34 |
| 5,102,816 | 4/1992 | Manukonda et al. | 437/34 |
| 5,102,827 | 4/1992 | Chen et al. | 437/34 |
| 5,132,241 | 7/1992 | Su | 437/34 |

*Primary Examiner*—Olik Chaudhuri
*Assistant Examiner*—Long Pham
*Attorney, Agent, or Firm*—Theodore D. Lindgren; Leo N. Heiting; Richard L. Donaldson

[57] ABSTRACT

A method for making a NMOS self-aligned contact in CMOS circuits without an extra mask is described. The maskless contact technique makes use of the fact that the blanket N-type implant, self-aligned to exposed field-oxide edge, will not change the P+ diffusion to N-type. The net P+ concentration in the contact region is reduced slightly but does not degrade the PMOS device performance.

8 Claims, 10 Drawing Sheets

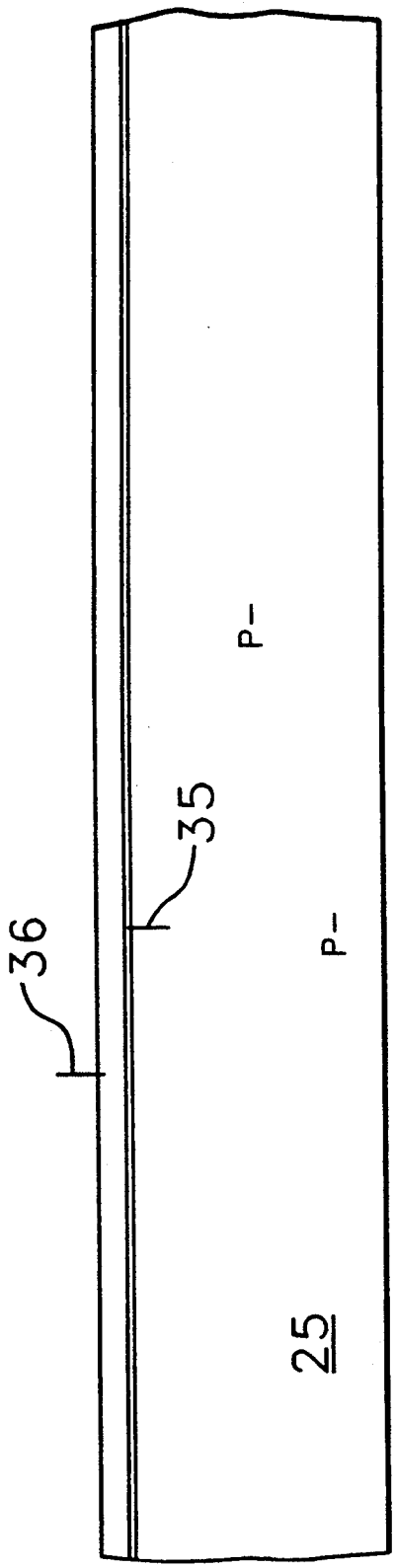
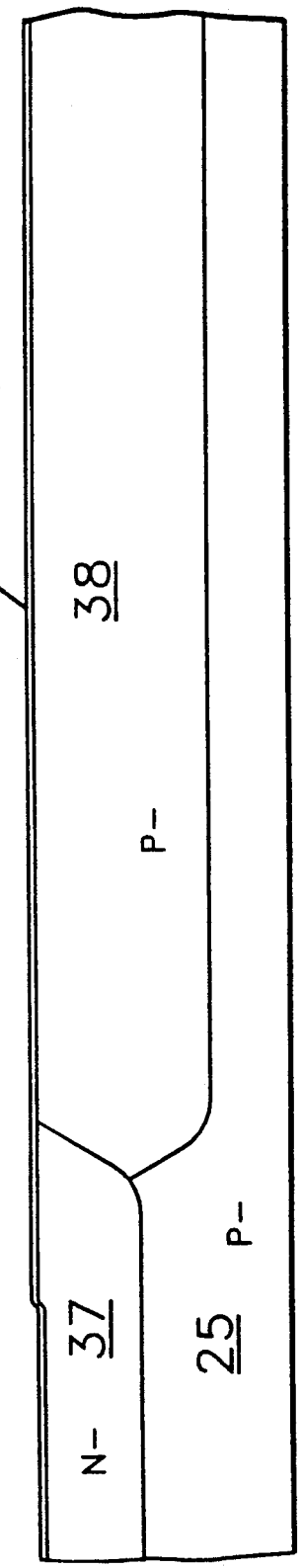
Fig. 8a
Fig. 8b

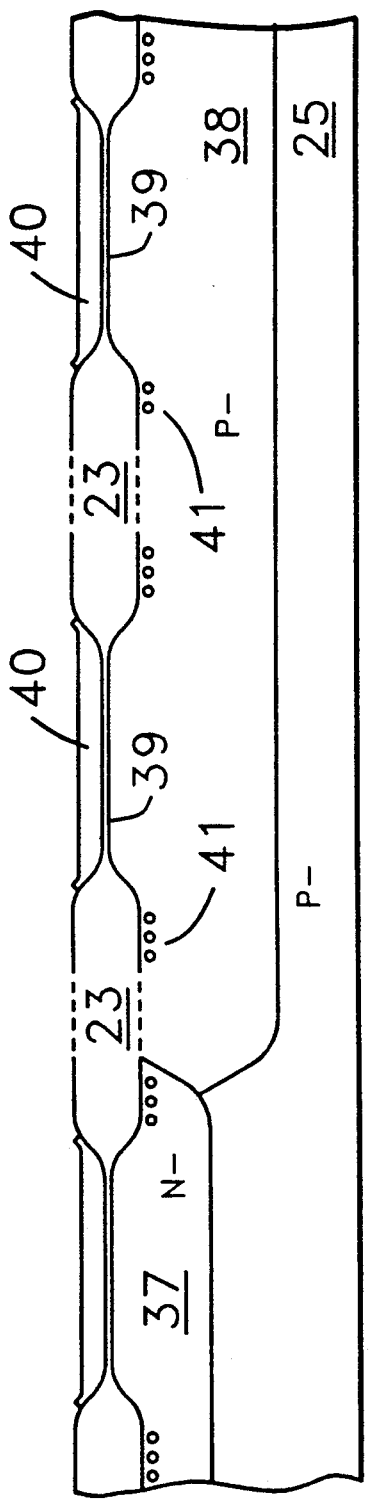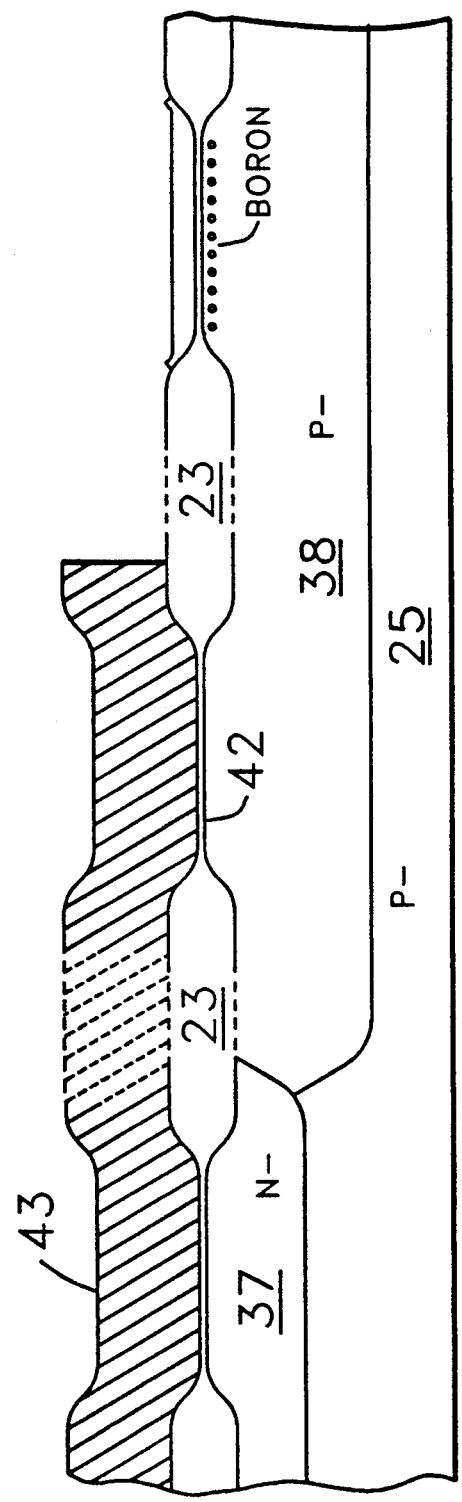
Fig. 8c
Fig. 8d

SELF-ALIGNED CONTACT PROCESS FOR COMPLEMENTARY FIELD-EFFECT INTEGRATED CIRCUITS

NOTICE

Copyright © 1992 Texas Instruments Incorporated. A portion of this patent document contains material that is subject to copyright protection. Texas Instruments Incorporated has no objection to the facsimile reproduction of the issued patent or of those documents in the Patent and Trademark Office patent file pertaining to the issued patent. All other copyright rights are reserved.

RELATED APPLICATIONS

This application discloses subject matter also disclosed in co-pending U.S. patent application Ser. No. 07/560,950 filed Aug. 1, 1990, (now Ser. No. 07/723,735 filed Jun. 20, 1991) and assigned to Texas Instruments Incorporated (TI-15203A), the assignee of this invention. The foregoing patent application is hereby incorporated herein by reference.

BACKGROUND OF THE INVENTION

This invention relates to semiconductor devices and, more particularly, to self-aligned contacts in complementary-field-effect-type (CMOS) circuits such as memory circuits and to a method for making those self-aligned contacts.

Integrated memory circuits comprise at least two parts, the memory cell array and the peripheral circuitry. In integrated CMOS memory circuits, the array of memory cells is generally constructed using NMOS field-effect transistors because of the speed advantage over PMOS field-effect transistors, which are included in the peripheral circuitry. The diffusion contact for each memory cell accounts for a significant percentage of the cell area both because of the required contact size and because of the required diffusion-overlap for the contact. One method to reduce the cell area is to use a diffusion contact that is self-aligned to the field-oxide edge.

Because of the presence of PMOS contacts in the peripheral circuitry, an extra contact mask has heretofore been needed to form a diffusion contact that is self-aligned to the field-oxide edge. Adding the extra mask has two disadvantages. One of those disadvantages is an increase in wafer process cost. The other disadvantage is that the extra mask exposes already-formed contacts to the resist process, making it more difficult to produce clean contacts than when using a standard single-mask contact process.

SUMMARY OF THE INVENTION

Accordingly, this invention is a NMOS diffusion contact (to the cell or to a peripheral circuit or to both), self-aligned to field-oxide edge and, therefore, formed without use of an extra mask. The maskless self-aligned contact eliminates the need for the diffusion overlap region that has heretofore been necessary to allow for lithographic misalignment encountered during manufacturing.

The process for forming the contact includes a blanket self-aligned N-type dopant implant that does not change the P+ diffusion contact area to N-type. That is, the net concentration of the P+ diffusion contact area receiving the blanket N-type implant is reduced slightly, but is not reduced to the extent that PMOS device performance is degraded.

BRIEF DESCRIPTION OF THE DRAWINGS

The novel features of this invention are set forth in the appended claims. The invention, its features, and its advantages are described below in conjunction with the following drawings:

FIGS. 8A-8G are elevation views in section of a small part of a CMOS memory chip of this invention, showing contact areas, and taken at successive stages in the manufacture thereof.

DETAILED DESCRIPTION OF THE INVENTION

Figure 1:
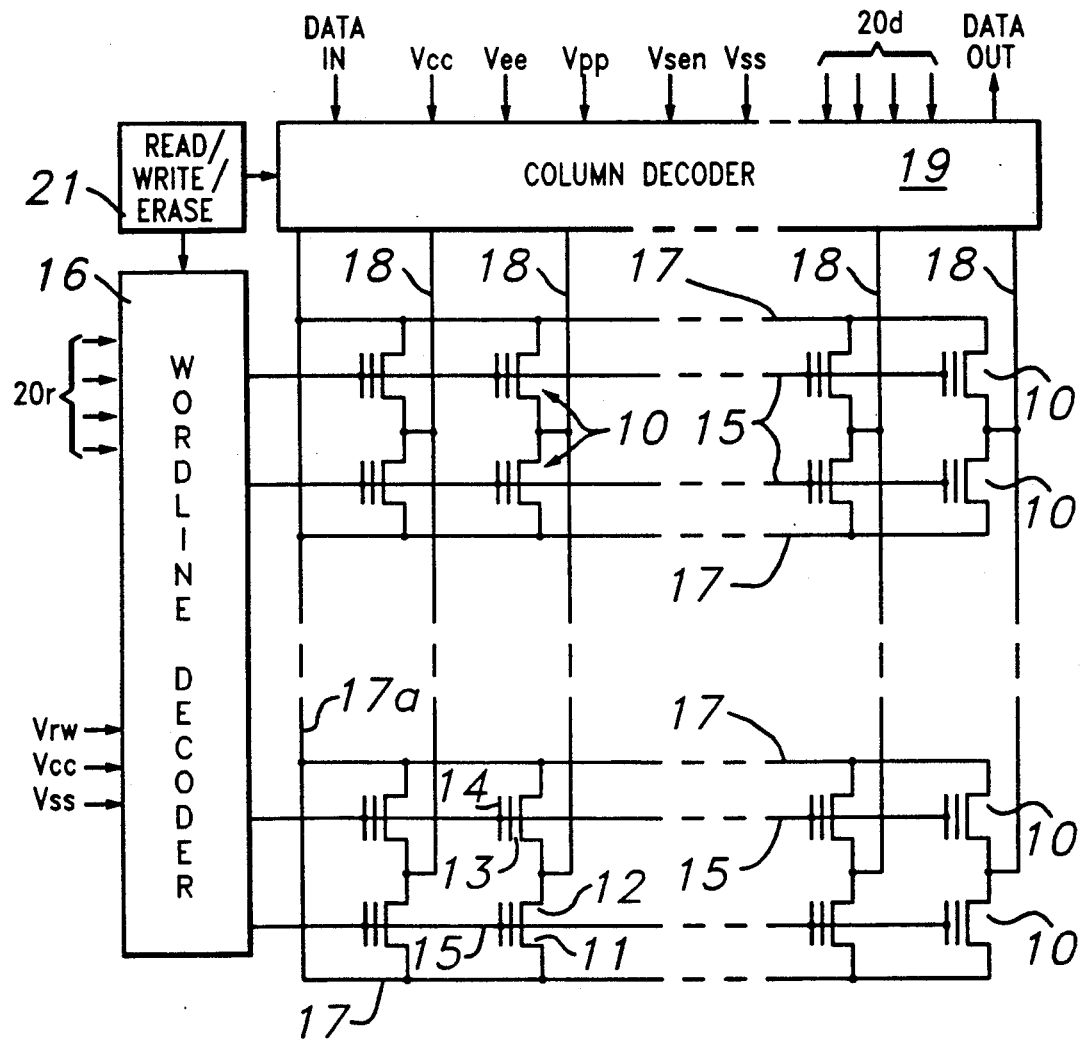
FIG. 1 is an electrical schematic diagram, in partial block form, of a memory cell array.

Referring to FIG. 1, an example array of memory cells, which is an integral part of a memory chip, is shown for the purpose of illustrating use of this invention. Each cell is a floating-gate transistor 10 having a source 11, a drain 12, a floating gate 13 and a control gate 14.

Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a column line 17a to a column decoder 19 and each of the drain-column lines 18 is connected to the column decoder 19.

In a write or program mode, the wordline decoder 16 may function, in response to a wordline address signal on lines 20r and to signals from Read/Write/Erase control circuit 21, (or microprocessor 21) to place a preselected first programming voltage Vrw (approx. +12 V) on a selected wordline 15, including a selected control-gate conductor 14. Column decoder 19 also functions to place a second programming voltage Vpp (approx. +5 to +10 V) on a selected drain-column line 18 and, therefore, the drain 12 of selected cell 10. Source lines 17 are connected to reference potential Vss. All of the deselected drain-column lines 18 are connected to reference potential Vss. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 to −6 V with respect to the channel region. For memory cells 10 fabricated in accordance with the preferred embodiment, the coupling coefficient between a control gate 14/wordline 15 and a floating gate 13 is approximately 0.5 to 0.6. Therefore, a programming voltage Vrw of 12 volts, for example, on a selected wordline 15, including the selected control gate 14, places a voltage of approximately +5 to +7 V on the selected floating gate 13. The floating gate 13 of the selected cell 10 is charged with channel-hot electrons during programming, and the electrons in turn render the source-drain path under the floating gate 13 of the selected cell 10 nonconductive, a state which is read as a "zero" bit. Deselected cells 10 have source-drain paths under the floating gates 13 that remain conductive, and those cells 10 are read as "one" bits.

In a flash erase mode, the column decoder 19 may function to leave all drain-column lines 18 floating. The wordline decoder 16 functions to connect all the wordlines 15 to reference potential Vss. The column decoder 19 also functions to apply a high positive voltage Vee (approx. +10 to +15 V) to all the source lines 17. These erasing voltages create sufficient field strength across the tunneling area between floating gate 13 and the substrate to generate a Fowler-Nordheim tunnel current that transfers charge from the floating gate 13, erasing the memory cell 10. Since the potential on the wordline 15 is 0 V, the cell 10 remains in the nonconducting state during erase, and therefore, no channel-hot carriers are generated. The field-plate breakdown voltage of the source line junction has been made high enough to inhibit hot-carrier injection. The high field-plate breakdown voltage of the source junction is achieved by this invention and will be described later.

In the read mode, the wordline decoder 16 functions, in response to a wordline address signal on lines 20r and to signals from Read/Write/Erase control circuit 21, to apply a preselected positive voltage Vcc (approx. +5 V) to the selected wordline 15, and to apply a low voltage (ground or Vss) to deselected wordlines 15. The column decoder 19 functions to apply a preselected positive voltage Vsen (approx. +1.0 V) to at least the selected drain-column line 18 and to apply a low voltage (0 V) to the source line 17. The column decoder 19 also functions, in response to a signal on address lines 20d, to connect the selected drain-column line 18 of the selected cell 10 to the data out terminal. The conductive or nonconductive state of the cell 10 connected to the selected drain-column line 18 of the selected cell 10 to the DATA OUT terminal. The read voltages applied to the memory array are sufficient to determine channel impedance for a selected cell 10 but are insufficient to create either hot-carrier injection or Fowler-Nordheim tunneling that would disturb the charge condition of any floating gate 13.

For convenience, a table of read, write and erase voltages is given in table I below:

TABLE 1

|  | Read | Write | Flash Erase |
|---|---|---|---|
| Selected Wordline | 5V | 12V | 0V (All) |
| Deselected Wordlines | 0V | 0V | — |
| Selected Drain Line | 1.0V | 5–10V | Float (All) |
| Deselected Drain Lines | Float | 0V | — |
| Source lines | 0V | About 0V | 10–15V (All) |

Figure 2:
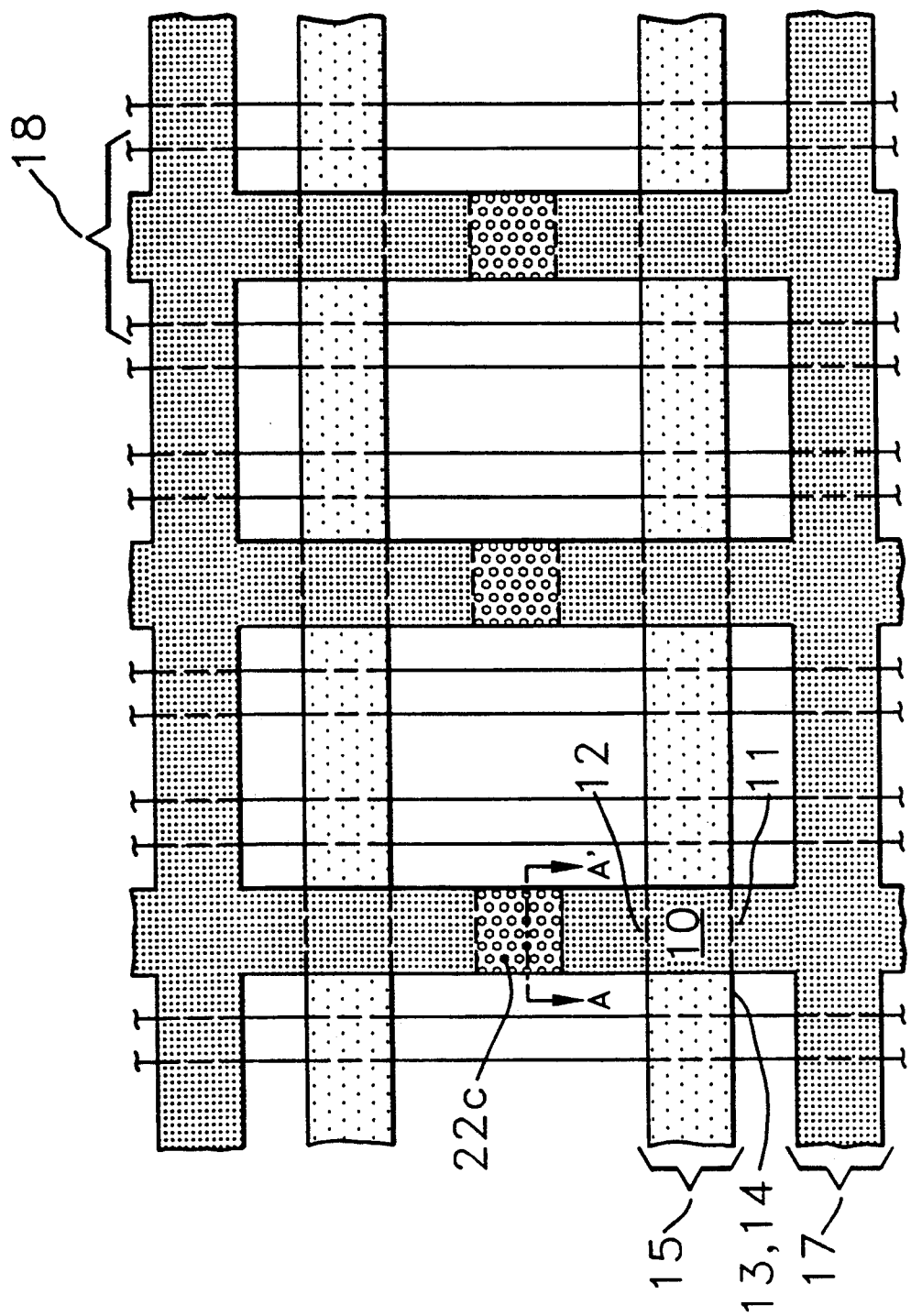
FIG. 2 is enlarged plan view of a small part of a memory cell array used as an example to describe this invention, illustrating the source and drain bitlines, and metal contacts.

An example of the CMOS memory array, which is an integral part of a memory chip, is shown in FIG. 2 for the purpose of illustrating this invention. The formation of each cell 10, which includes a source 11, a drain 12, a floating gate 13 and a control gate 14, and its operation such as program, erase and read has been described in U.S. patent application Ser. No. 07/560,950 filed Aug. 1, 1990, (now Ser. No. 07/723,735 filed Jun. 20, 1991) and assigned to Texas Instruments Incorporated (TI-15203A).

Figure 3:
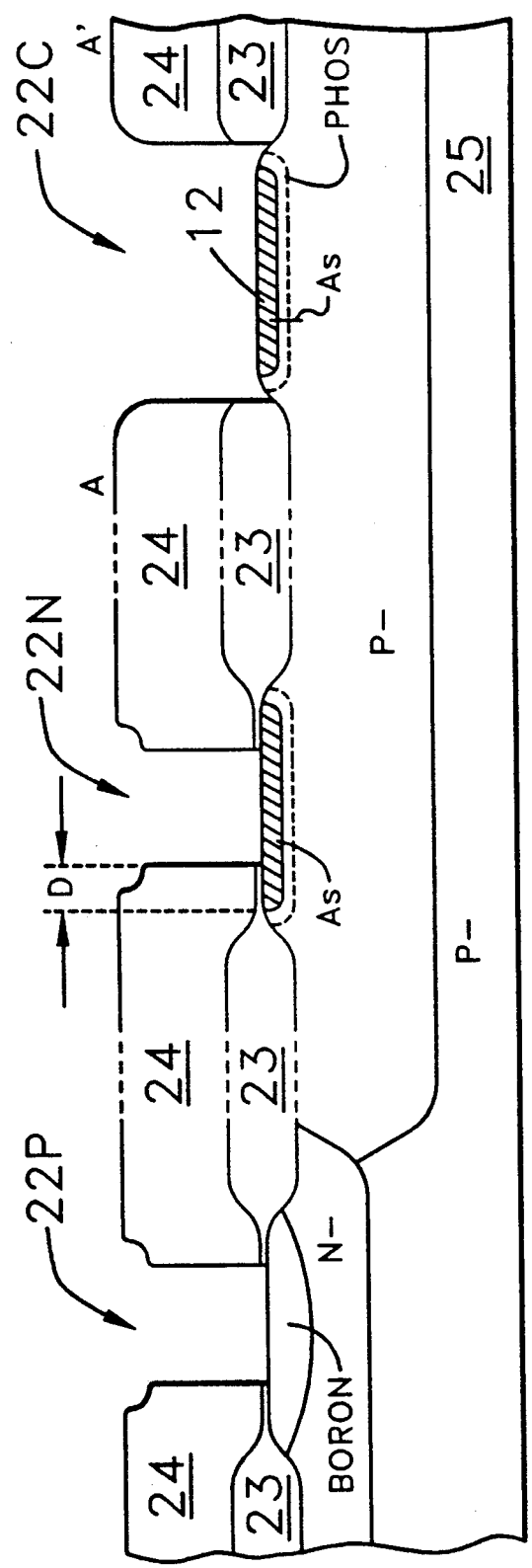
FIG. 3 is an elevation view in section of a small part of a flash memory cell according to one embodiment, taken along line AA' of FIG. 2, which is perpendicular to the drain bitline, showing the cell contact region between two field-oxide regions together with the doping profile and showing CMOS peripheral-circuit contact regions.

FIG. 3 shows the cross-sectional diagram of diffusion contacts 22C,22N,22P to NMOS memory array and to CMOS peripheral circuitry (NMOS and PMOS), showing all three types of contact 22C, 22N, 22P opening areas that result from contact etch. The dopant below each contact opening is part of a source 11 or drain 12. The field oxide 23 and borophosphosilicate glass (BPSG) layer 24 are isolation regions.

As can be seen in the FIG. 3, a contact 22C misalignment in the cell 10 area during the subsequent BPSG layer 24 etch can expose the field oxide 23. If the etch cuts deep into the field oxide 23, the single crystal silicon substrate 25 surface is exposed to the subsequent metal 26 (not shown in FIG. 3, see FIG. 8G) deposition. This exposure can cause a leaky drain 12/substrate 25 junction (for example) or, worse, a drain 12 or source 11 diffusion is shorted to the substrate 25. Hence, as shown at the contact area 22N, there is a diffusion-to-contact overlap distance D that is necessary to prevent contact or leakage between the substrate 25 and the metal 26 (see FIG. 8G). This requirement, however, makes the area of the diffusion contact 22C, for example, a significant percentage of a cell 10 area and, therefore, constrains cell scaling.

One method to eliminate diffusion-to-contact overlap requirement is to add a N-type, self-aligned implant after the contact 22C,22N,22P etch. That process, however, requires an extra contact mask. The extra contact mask is needed to protect PMOS contact 22P from the N-type dopant during self-aligned doping of contact 22C.

This extra mask can be avoided by use of a blanket self-aligned N-type, self-aligned implant of correct dose and energy for the cell contact 22C. The dose and energy is chosen such that the blanket N-type implant causes no adverse effects on the performance of PMOS devices with contacts 22P. Implantation of a low dose of phosphorous on the order of $1 \times 10^{14}$ to $6 \times 10^{14}$ ions/cm$^2$ at an energy level of perhaps 30 to 50 KeV, self-aligned to the field-oxide 23 edge, and followed by a low-temperature implant activation at 700° to 850° C. for about 30 minutes provides self-aligned cell contact 22C, but does not adversely affect the performance of PMOS devices.

Figure 4A:
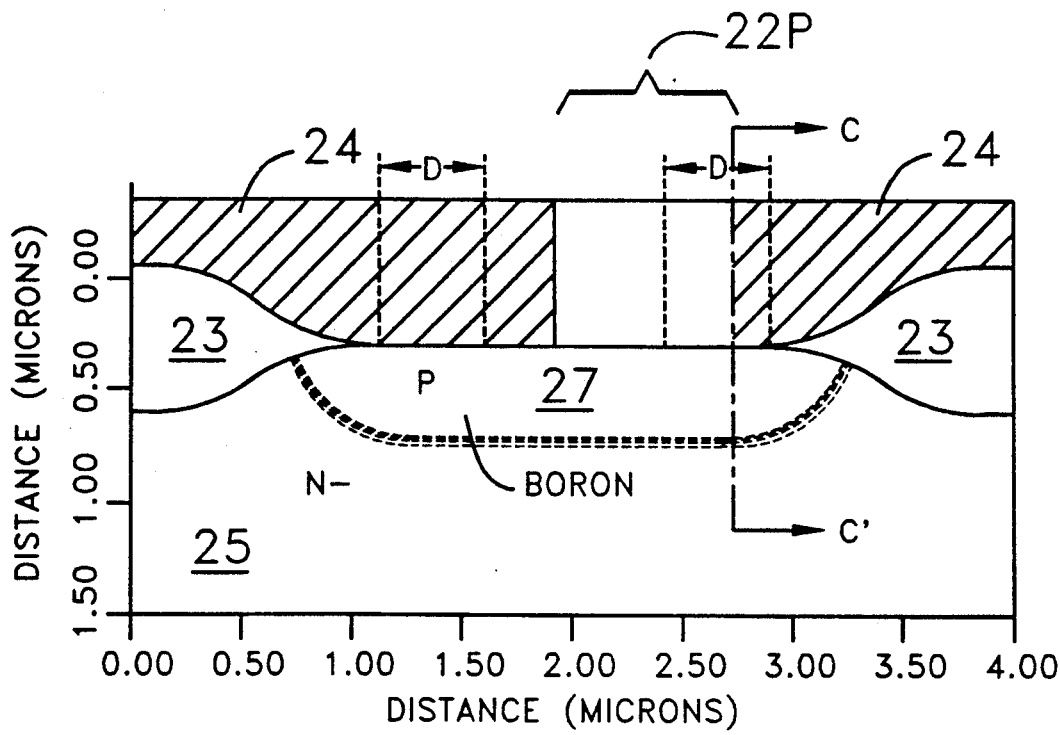
FIG. 4A is an elevation view of the process simulation results in section of a PMOS contact showing the doping profiles before the self-aligned implant.
Figure 4B:
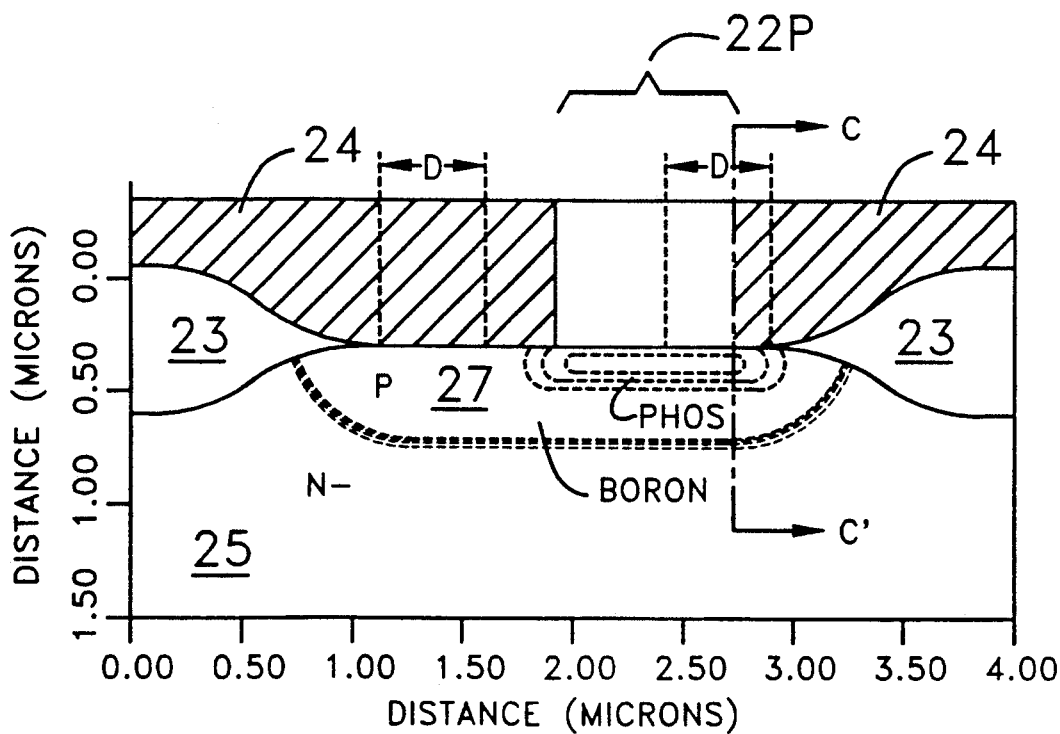
FIG. 4B is an elevation view of the process simulation results in section of a PMOS contact showing the doping profiles after the self-aligned implant.
Figure 5A:
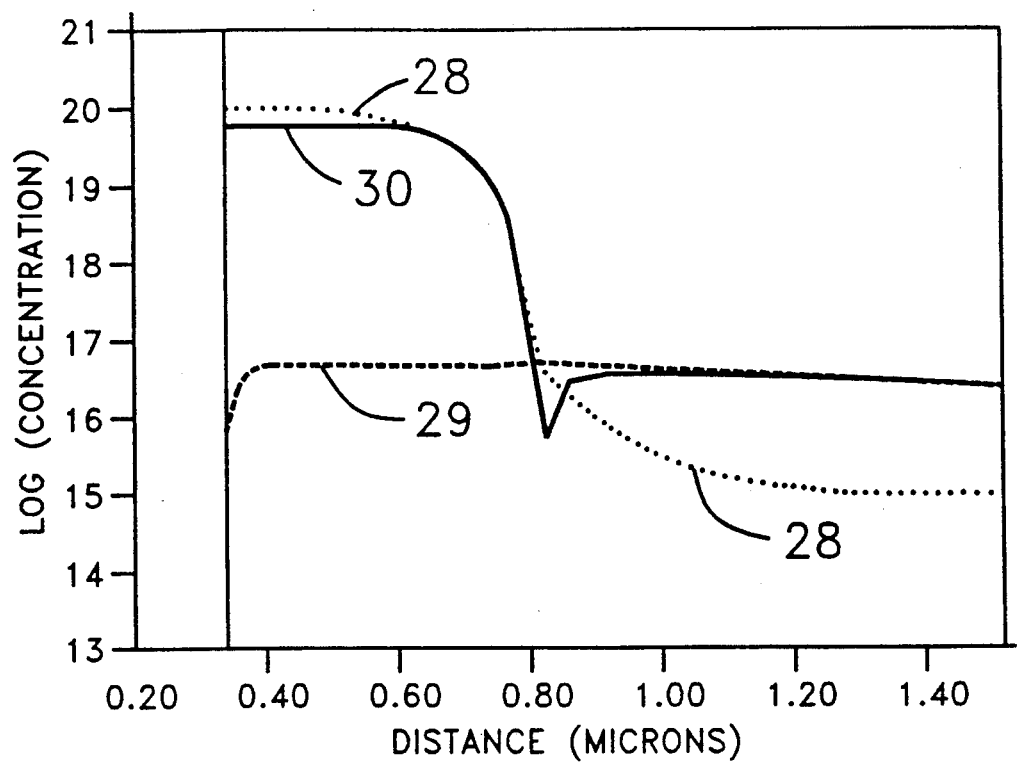
FIG. 5A is one-dimensional plot of the process simulation results of a PMOS contact, along line CC' of FIGS. 4A, showing the implant doping profiles before the self-aligned implant.
Figure 5B:
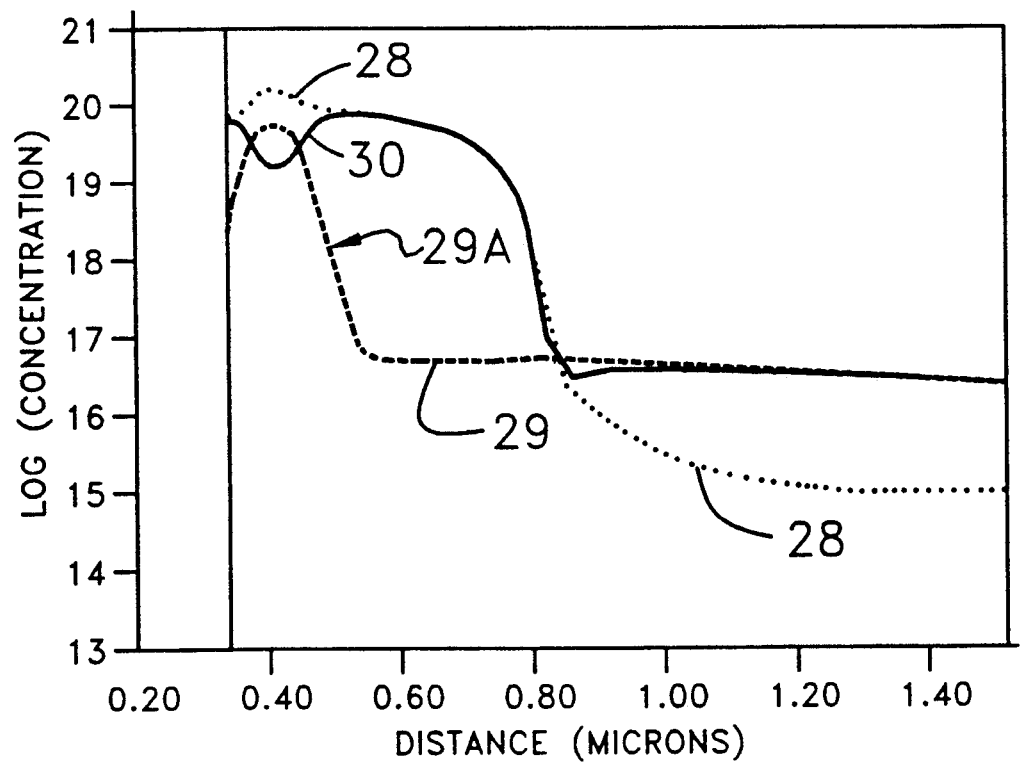
FIG. 5B is one-dimensional plot of the process simulation results of a PMOS contact, along line CC' of FIG. 4B, showing the implant doping profiles after the self-aligned implant.

Examples of a computer simulation showing the effect of the implant dose, implant energy, and anneal process on the junction profile of the PMOS contact 22P region with contact misaligned, before and after the blanket N-type self-aligned implant, are shown in FIGS. 4A and 4B, respectively. Cross-sections along the line CC' of FIGS. 4A and 4B are shown in FIGS. 5A and 5B, respectively. The heavily doped boron region 27, shown in FIG. 4A, is formed from a PMOS source (or drain) implant on the order of $1 \times 10^{15}$ to $5 \times 10^{15}$ ions/cm$^2$ at an energy level of about 30 KeV, and extends under the field-oxide 23 edge. The overlap of the field-oxide 23 edge around the contact area 22P is designed so that lithographical misalignment and subsequent BPSG etch will not expose the PMOS substrate diffusion 25. Hence, as shown in FIG. 4B, a low-dose, low-energy, self-aligned, phosphorous-implant performed after the contact 22P etch does not degrade the PMOS device behavior.

A one-dimensional concentration profile is shown in FIG. 5A, along the cross section CC' of FIG. 4A, with the contact 22P hole misaligned but without the self-aligned phosphorous implant. The dashed line 28 represents the boron source (or drain) implant. The dotted line 29 is the N-tank 25 background concentration. The solid line 30 represents the net impurity concentration.

Referring now to FIG. 5B, a one-dimensional concentration profile is shown along the cross section CC' of FIG. 4B, with contact 22P hole misaligned and with the self-aligned phosphorous implant. The extra dotted bell-shaped part 29A of curve 29 is from the self-aligned phosphorous implant (dosage of about $4 \times 10^{14}$ ions/cm$^2$ at an energy level of about 50 KeV and followed by an approximately 30-minute anneal at about 850° C.). The phosphorous implant therefore represents less than ten percent of the P+ concentration.

Figure 6:
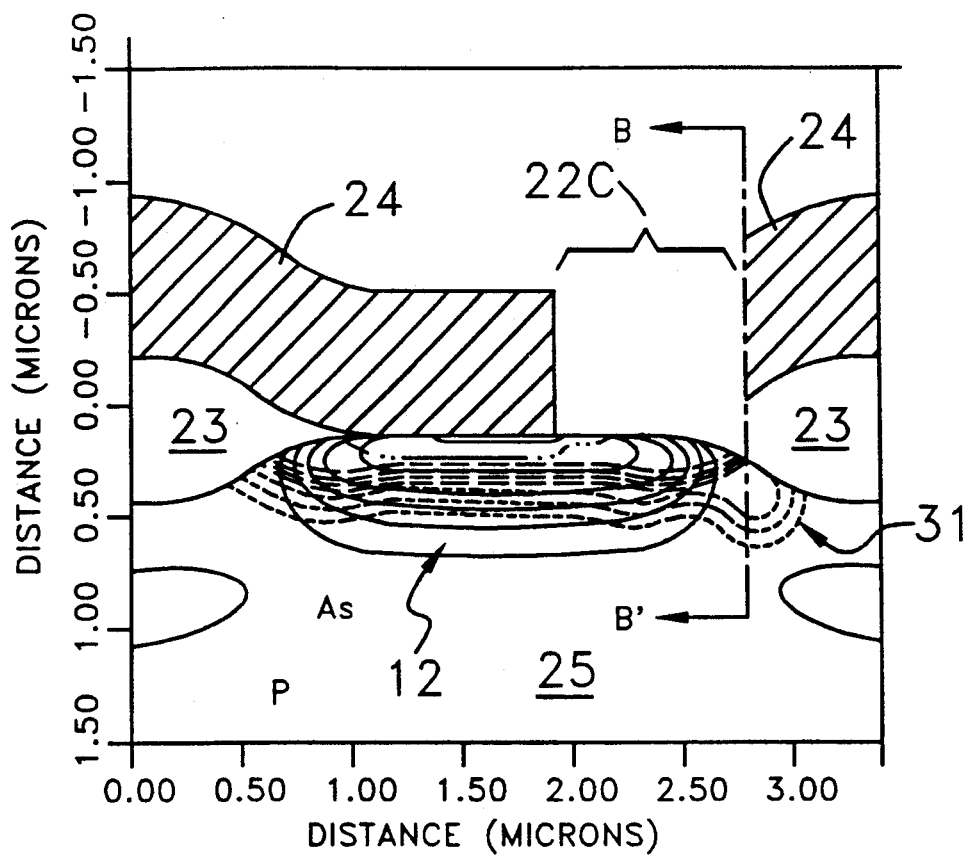
FIG. 6 is an elevation view of the process simulation results in section of a flash cell (NMOS), along line AA' of FIG. 2, showing the implant doping profiles before and after the self-aligned implant.
Figure 7:
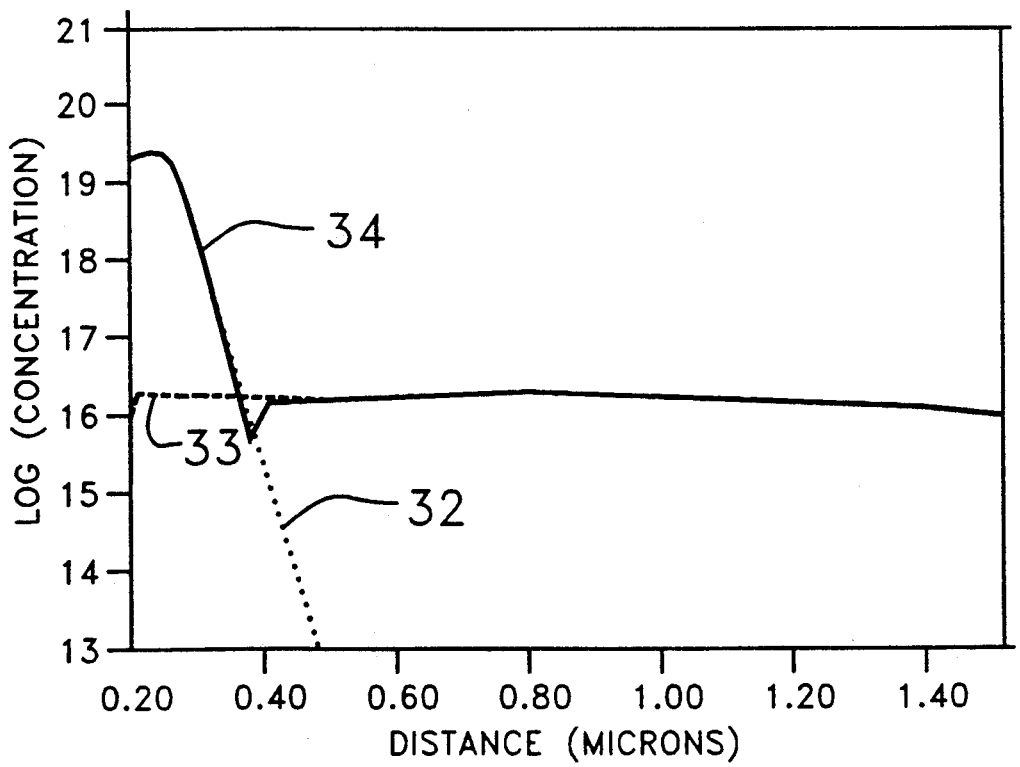
FIG. 7 is one-dimensional plot of process simulation results of a NMOS-type flash cell, along line BB' of FIG. 6, showing the implant doping profiles before and after a self-aligned implant.

The memory-cell contact 22C area along the cross section AA' of FIG. 2 is shown in FIG. 6. The contact 22C opening has the same width as the drain 12 diffusion. However, the contact 22C mask has been misaligned, and the contact 22C etch has exposed the single crystal silicon 25 surface. To prevent subsequent metal 26 shorts to the substrate 25, a low-dose, self-aligned phosphorous doping 31 on the order of $4 \times 10^{14}$ ions/cm$^2$ at an energy level of about 50 KeV has been implanted into the wafer and followed by an approximately 30-minute anneal at about 850° C. The one-dimensional doping profile of this self-aligned implant 31, along line BB', is shown in FIG. 7. Curve 32 indicates the phosphorous concentration of implant 31. Curve 33 indicates the boron concentration of the threshold voltage implant. Curve 34 indicates the net impurity concentration. As indicated in the FIGS., with the self-aligned implant 31, the exposed P-type substrate 25 is converted to N-type, and the drain 12 junction depth is increased.

A method of fabricating the memory-contact regions 22C,22N,22P of FIG. 3 is now described in reference to FIGS. 8A-8G. The starting material is a slice of P-type silicon of which the substrate 25 is only a small portion. The slice is perhaps 6 inches in diameter, while an individual member cell is only a few microns wide. A number of process steps are normally performed to create transistors peripheral to the memory array. For example, the EEPROM memory device may be of the complementary field-effect type (CMOS) devices having N-tanks and P-tanks formed in the substrate 25 as part of a process to create peripheral circuitry transistors. The formation of the N-tanks and P-tanks is a known art, and will be discussed briefly.

A pad-oxide layer 35 about 400 Angstroms thick is grown or deposited on the face of substrate 25. The pad-oxide layer 35 protects the substrate 25 during the initial fabrication steps and will be subsequently removed. A silicon-nitride layer 36 is then deposited over the pad-oxide layer 35 using low-pressure chemical vapor deposition, as shown in FIG. 8A. The silicon-nitride 36 layer is then patterned with resist (not shown) and plasma-etched to expose areas where a phosphorous implant, on the order of $1 \times 10^{13}$ ions/cm$^2$ at an energy level of about 50 KeV, is performed to create a N-tank region 37. After the resist removal and cleanup, the wafer is annealed at approximately 1000° C. for about two hours, followed by an oxidation. The 5000 to 6000 Angstroms of grown oxide over the N-tank regions will be used as a mask for subsequent P-tank formation. Following the removal of pad oxide 35 and nitride 36 layers, about $1 \times 10^{12}$ ions/cm$^2$ of boron at an energy level of about 35 KeV is implanted to form P-tank 38. This is followed by a tank-oxide etch, a tank drive, and the formation of a second pad-oxide 39, as shown in FIG. 8B.

Figure 8E:
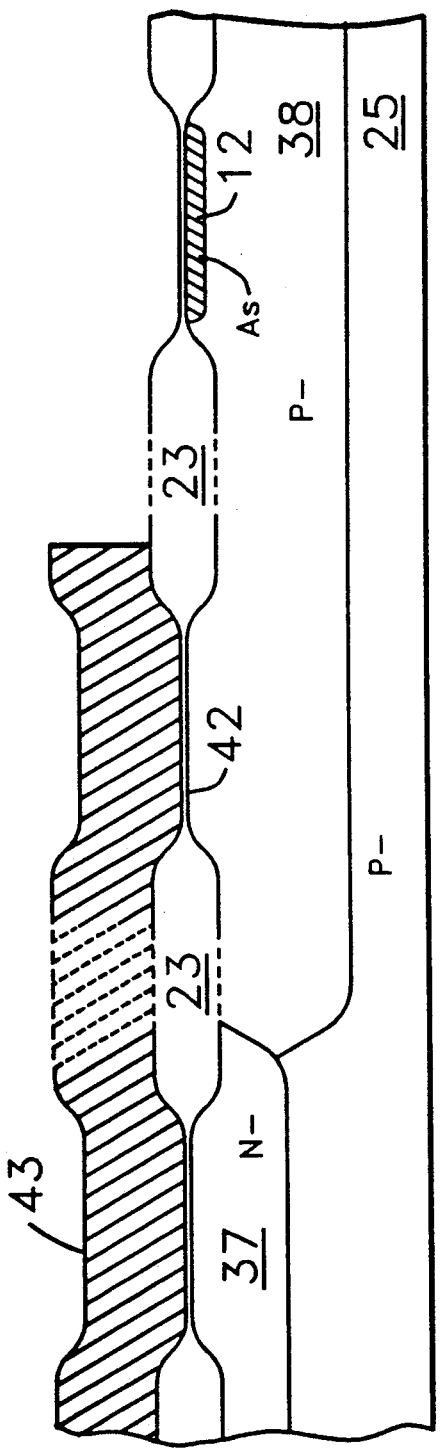
Figure 8F:
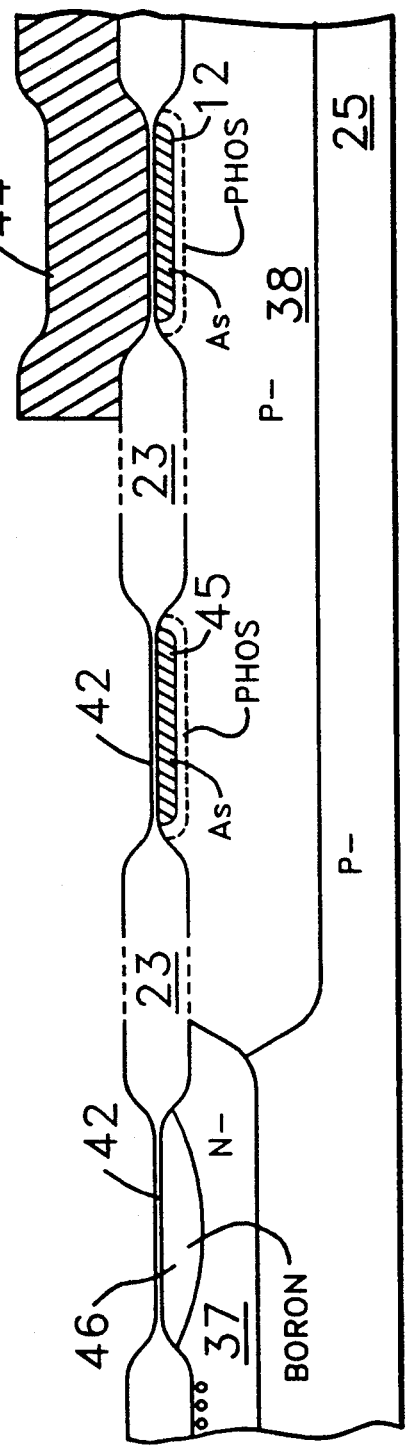
Figure 8G:
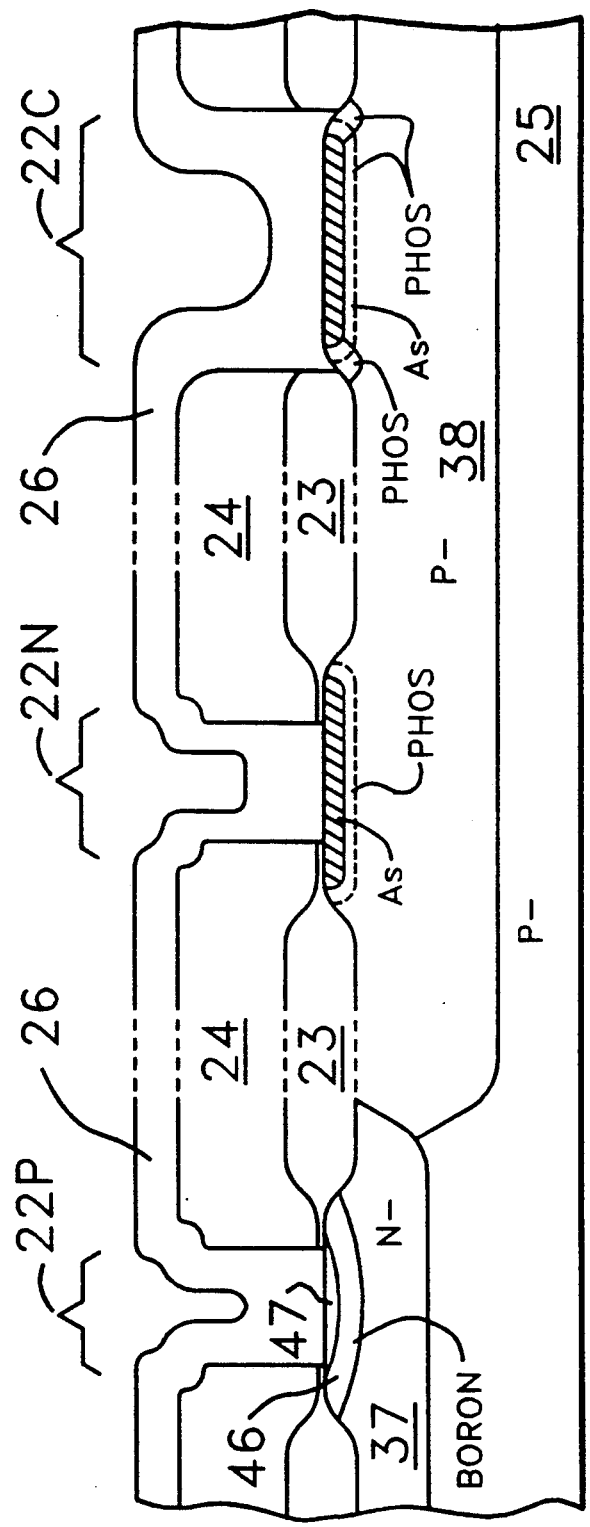

A silicon-nitride layer 40 is again deposited over the pad-oxide 39. The nitride layer 40 is then patterned with resist (not shown) and plasma-etched to expose areas where thick field-insulators 23 are to be formed, as illustrated in FIG. 8C. A boron implant at a dose of about $7 \times 10^{12}$ ions/cm$^2$ at an energy level of about 35 KeV is performed to create a P+ channel stop region 41 that will provide isolation between transistors as well as contact regions 22C,22N,22P. After removing the photoresist, the thick field oxide 23, as illustrated in FIGS. 8C-8G, is thermally grown in a localized oxidation process to a thickness of about 6000-10000 Angstroms by exposure to steam at about 900° C. at one atmosphere for several hours.

Alternatively, a high-pressure oxidation (HIPOX) can be used to decrease oxidation time. As is well-known, the oxide grows beneath the edges of the silicon-nitride layer 40, creating "bird's beak" areas instead of abrupt transitions.

Referring next to FIG. 8D, the remaining portions of the pad-oxide layer 39 and silicon-nitride layer 40 are removed.

The procedure exposes the silicon substrate 25 between the cell-isolation thick-field insulators 23. Next, with a resist pattern, a boron implant, in the range of $6 \times 10^{12}$ to $1 \times 10^{13}$ ions/cm$^2$ at an energy level of about 30 KeV, is performed to set the threshold voltages $V_T$ of the cells of the array. Next, after resist removal, and a pre-gate clean up, a high-quality oxide 42 is grown thermally. The processes for forming the subsequent floating gate 13, inter-level oxide, control gate 14, and stack etch have been described for example, in U.S. patent application Ser. No. 07/560,950 filed Aug. 1, 1990, (now Ser. No. 07/723,735, filed Jun. 20, 1991) and assigned to Texas Instruments Incorporated (TI-15203A), and these will not be discussed here. The second layer of polysilicon used for the control-gate 14 step of FAMOS, is also used as a gate material for the CMOS devices. FIG. 8D illustrates a photoresist 43 masking the area external to the memory array.

Following the NMOS memory cell 10 resist patterning, the next step is to implant source 11 (not shown) and drain 12 junctions of the array with arsenic at about $5 \times 10^{15}$ ions/cm$^2$ at an energy level of perhaps 90 to 140 KeV, as shown in FIG. 8E. After the implant and after appropriate resist removal and cleanup, the substrate 25 is annealed at 900° to 1000° C. in an annealing ambient to repair the implant damage and to provide N+ junction drive.

Peripheral-circuitry-logic CMOS devices are completed after this step. An optional oxide layer is grown or formed after this process on the sides and top of the stack for improved data retention. The memory array may be masked with photoresist 44 at this point.

NMOS and PMOS source and drain junctions are formed by using implants self-aligned to the CMOS gate and field-oxide region (not shown). First the NMOS junctions are formed with a phosphorous implant, on the order of $1 \times 10^{13}$ ions/cm$^2$ at energy level of about 80 KeV, followed by resist removal and cleanup, and then a thick oxide deposition and etch, leaving behind a thick side-wall oxide spacer. The side-wall oxide spacer is well-known technique for making lightly-doped-drain (LDD) structures for NMOS devices. Next step is the LDD source and drain resist pattern, followed by a combination of arsenic and phosphorous implants, on the order of $5 \times 10^{15}$ ions/cm$^2$ at an energy level of about 135 KeV and $4 \times 10^{14}$ ions/cm$^2$ at an energy level of about 100 KeV, respectively. NMOS memory contact regions 22N will also receive the above NMOS source/drain implant, forming the N+ arsenic/phosphorous region 45, shown in FIG. 8F. After removing resist and after cleanup, the silicon is again patterned with resist and PMOS areas are exposed to a boron implant 46 on the order of $3 \times 10^{15}$ ions/cm$^2$. This boron region 46 is also shown in FIG. 8F.

After defining the sources and drains, resist removal and cleanup, a BPSG layer 24 is then deposited over the face of the slice. A high-temperature anneal is performed in an annealing ambient, which provides BPSG densification, implant anneal, and junction drive. The BPSG layer and planar oxide are etched to form contact holes 22C,22N,22P shown in FIG. 8G, in both on-array and off-array (CMOS peripheral circuitry) regions.

A maskless self-aligned contact process is realized at this stage by adding a blanket phosphorous implant, in the ranges of $1 \times 10^{14}$ to $6 \times 10^{14}$ ions/cm$^2$ and at an energy level of 30 to 50 KeV, self-aligned to the field-oxide 23 edge, and followed by a low temperature anneal at 700° to 850° C. for about 30 minutes. This self-aligned implant is also displayed in FIG. 8G as a small and shallow N-region 47.

Next, metal 26 conductors and protective overcoat layers (not shown) are formed by standard processes.

While the invention has been described with reference to an illustrative embodiment, this description is not meant to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments that fall within the true scope of the invention.

We claim:

1. A process for forming at least first and second electrical contacts to the substrate of an integrated circuit, said substrate having a conductivity of a first-type, said first contact being to a first diffused region of said substrate having a conductivity of a second-type opposite said first-type, said second contact being to a second diffused region of said substrate having a conductivity of said first-type, said process comprising:
    forming field oxide on said substrate, except in at least a first area generally correspondent to first diffused region;
    using said field oxide as a mask, doping said first area with a second-type dopant;
    forming a layer of borophosphosilicate glass on the surface of said substrate;
    etching through said borophosphosilicate glass to expose said first contact region, said first contact region offset from said first area, said etching extending through at least a part of said field oxide to expose a portion of said substrate outside of said first area; and
    blanket implanting by self-alignment a second-type dopant in a quantity sufficiently small that said implant does not change said second diffusion region to said conductivity of said second-type and does change said part of said substrate to said conductivity of said second-type.

2. The process of claim 1, wherein said first-type conductivity is P-type, said second-type conductivity is N-type.

3. The process of claim 1, including, after said blanket implant, depositing a layer of metal over said substrate.

4. The process of claim 1, including, after said blanket implant, depositing a layer of metal over said substrate and patterning and etching said metal to form electrical conductors.

5. The process of claim 1, wherein said blanket implant is phosphorous on the order of $1 \times 10^{14}$ to $6 \times 10^{14}$ ions/cm$^2$ at an energy level of 30 to 50 KeV.

6. The process of claim 1, wherein said blanket implant is self-aligned to at least one edge of said field oxide.

7. The process of claim 1, wherein said blanket implant is followed by a low-temperature implant activation at 700° to 850° C. for about 30 minutes.

8. A process for forming at least first and second electrical contacts to the substrate of an integrated circuit, said substrate having P-type conductivity, said first contact being to a first diffused region of said substrate having N-type conductivity, said second contact being to a second diffused region of said substrate having P-type conductivity, said process comprising:
    forming field oxide regions on said substrate except in at least a first area;
    using said field oxide as a mask, doping said first area with a N-type dopant;
    forming a layer of borophosphosilicate glass on the surface of said substrate;
    etching through said borophosphosilicate glass to expose said first contact region, said first contact region offset from said first area, said etching extending through at least a part of said field oxide to expose a part of said substrate outside of said first area; and
    blanket implanting by self-alignment a N-type in a quantity sufficiently small that said implant does not change said second diffusion region to said conductivity of said N-type and does change said part of said substrate to said conductivity of said N-type, including, after said blanket implant, depositing a layer of metal over said substrate and patterning and etching said metal to form electrical conductors;

wherein said blanket implant is phosphorous on the order of $1\times10^{14}$ to $6\times10^{14}$ ions/cm$^2$ at an energy level of 30 to 50 KeV;

wherein said blanket implant is self-aligned to at least one edge of a said field oxide region; and wherein said blanket implant is followed by a low-temperature implant activation at 700° to 850° C. for about 30 minutes.

* * * * *